(12) United States Patent
Yang et al.

(10) Patent No.: US 7,245,158 B2
(45) Date of Patent: Jul. 17, 2007

(54) CIRCUIT WIRING LAYOUT IN SEMICONDUCTOR MEMORY DEVICE

(75) Inventors: Hyang-Ja Yang, Suwon-si (KR);
Ji-Suk Kwon, Seoul (KR); Hwa-Jin Kim, Seoul (KR)

(73) Assignee: Samsung Electronics Co., Ltd., Suwon-si, Gyeonggi-Do (KR)

( * ) Notice: Subject to any disclaimer, the term of this patent is extended or adjusted under 35 U.S.C. 154(b) by 111 days.

(21) Appl. No.: 11/266,544

(22) Filed: Nov. 3, 2005

(65) Prior Publication Data

US 2006/0114030 A1    Jun. 1, 2006

(30) Foreign Application Priority Data

Nov. 29, 2004    (KR) .................... 10-2004-0098513

(51) Int. Cl.
*G11C 8/00*    (2006.01)
*G11C 11/34*    (2006.01)
(52) U.S. Cl. .................... 326/105; 326/101; 326/106; 365/185.23; 365/230.06
(58) Field of Classification Search ................ 326/101, 326/104–106; 365/185.23, 230.06
See application file for complete search history.

(56) References Cited

U.S. PATENT DOCUMENTS

| 5,295,105 | A   | * | 3/1994  | Atsumi ................. 365/185.13 |
| 6,084,819 | A   |   | 7/2000  | Kablanian |
| 6,352,868 | B1  |   | 3/2002  | Yang |
| 6,741,510 | B2  | * | 5/2004  | Ohbayashi et al. ......... 365/201 |
| 2004/0218456 | A1 | * | 11/2004 | Choi .................... 365/230.06 |

* cited by examiner

*Primary Examiner*—Rexford Barnie
*Assistant Examiner*—Jason Crawford
(74) *Attorney, Agent, or Firm*—F. Chau & Associates, LLC

(57) ABSTRACT

A circuit wiring layout in a semiconductor memory device comprises first and second p-type MOS transistors having channels connected to each other in series, and first and second n-type MOS transistors having sources connected in parallel to a drain of the second p-type MOS transistor, the p- and n-type MOS transistors forming a decoder NOR gating portion. The first and second n-type MOS transistors having drains connected to first and second main lines, respectively, and sources connected to a section line. The first and second p-type MOS transistors having gates to which select signals for first and second accesses are applied, respectively. The first and second p-type MOS transistors share an active junction with each other in a first area. The first and second n-type MOS transistors are spaced from the first area in a direction of the section line and have independent active junctions.

30 Claims, 6 Drawing Sheets

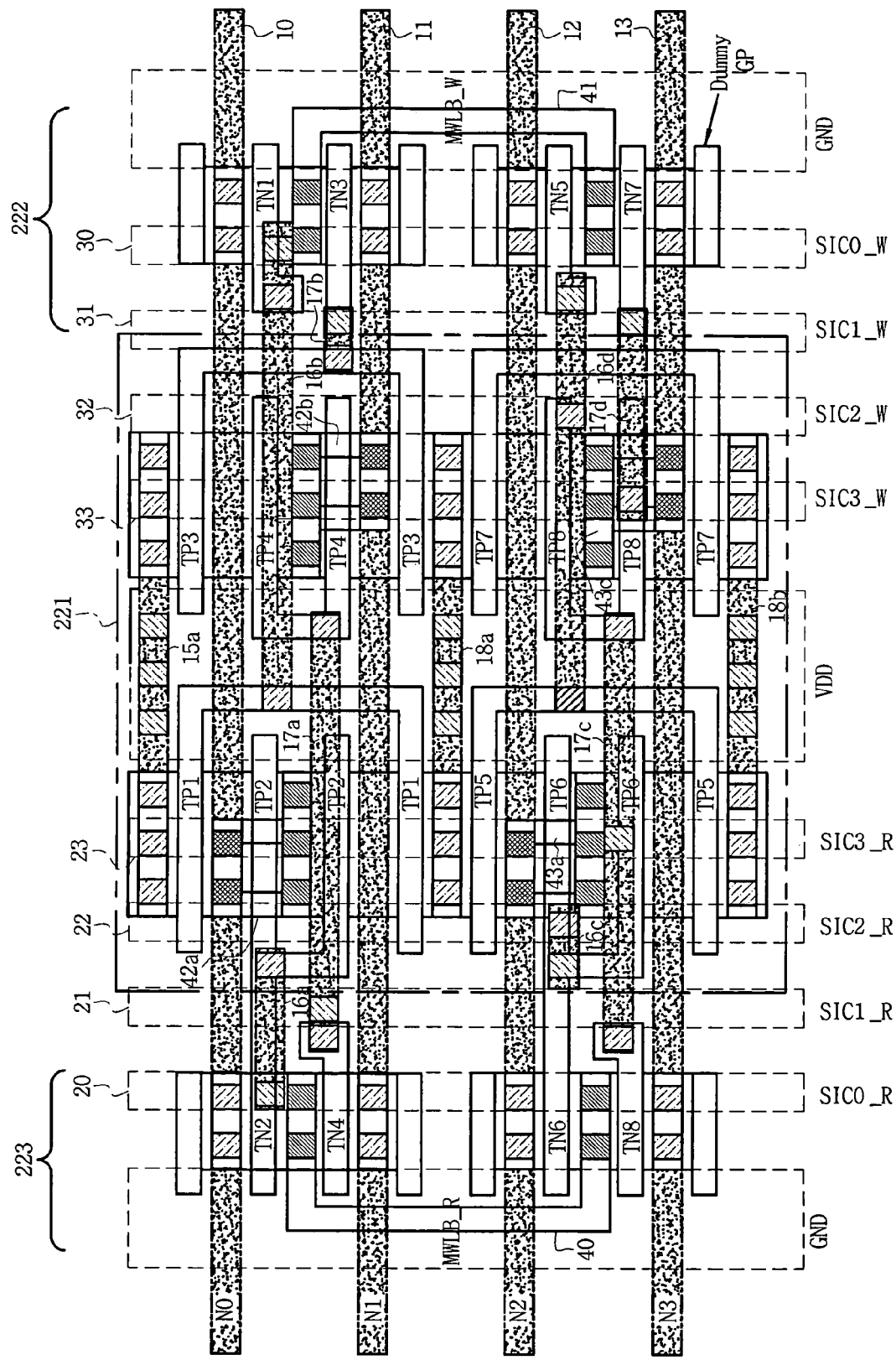

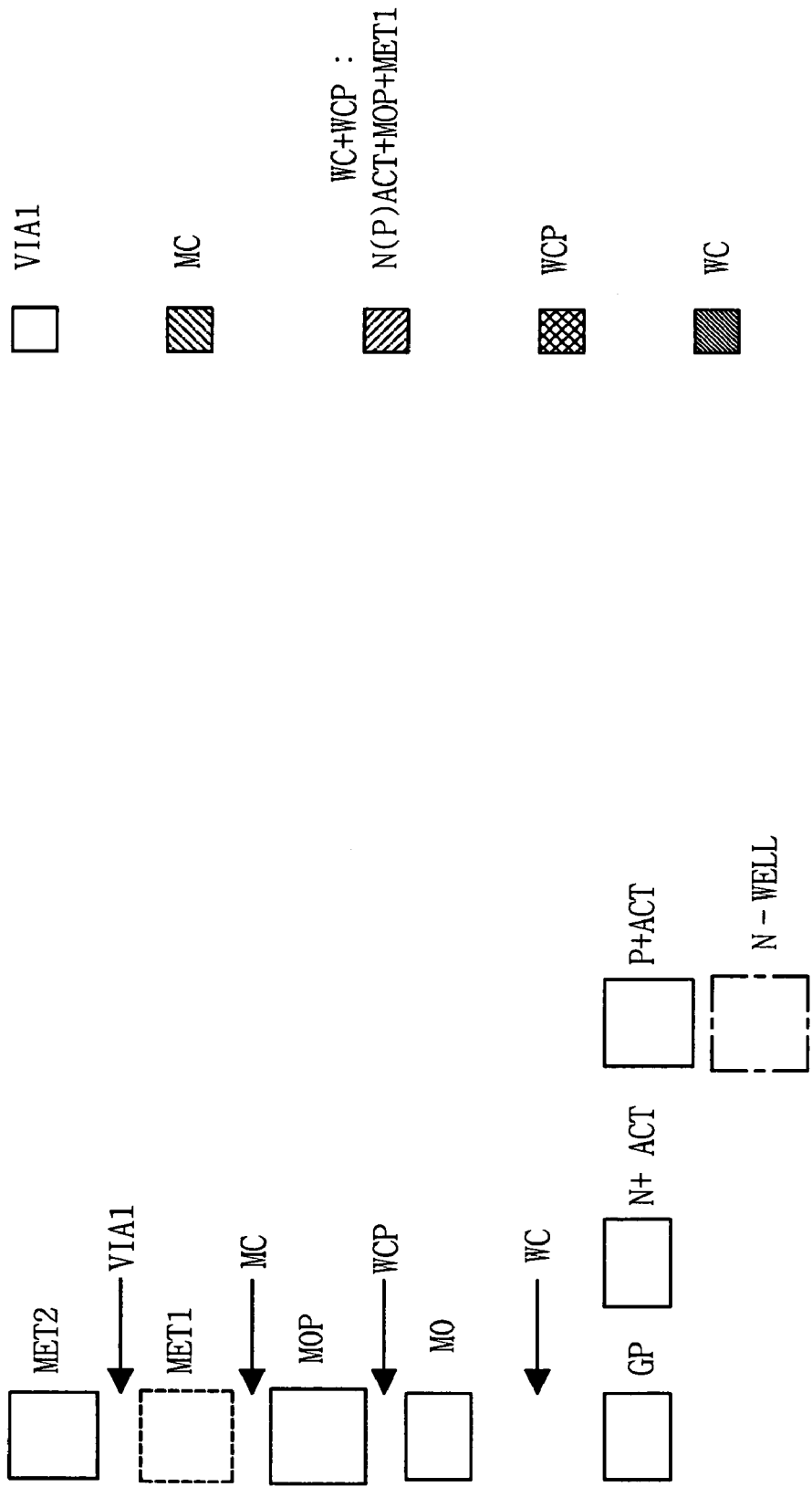

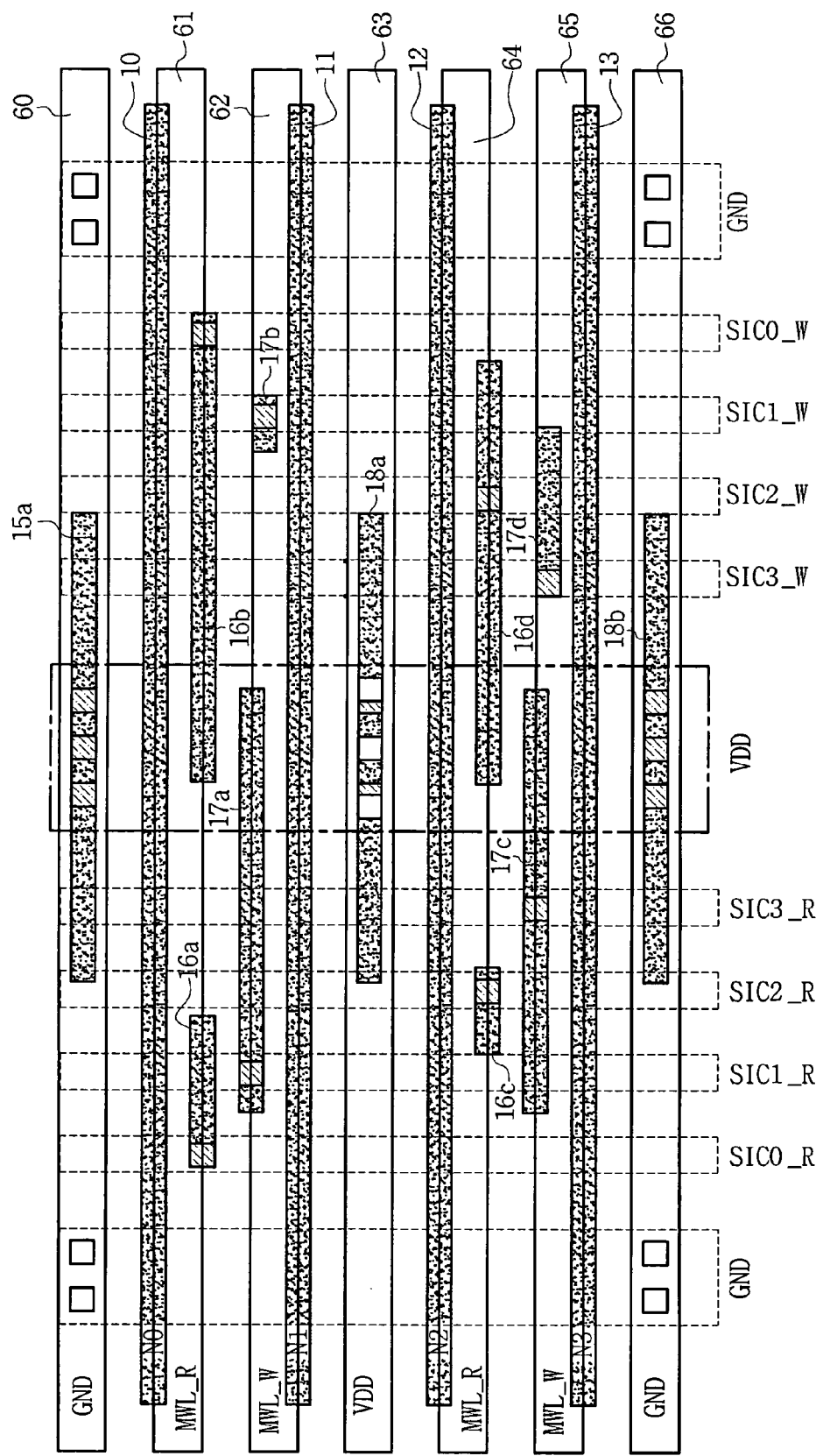

CIRCUIT WIRING LAYOUT IN SEMICONDUCTOR MEMORY DEVICE

CROSS TO REFERENCE TO RELATED APPLICATION

This application claims the benefit of Korean Patent Application No. 10-2004-0098513, filed Nov. 29, 2004, the disclosure of which is hereby incorporated herein by reference in its entirety.

BACKGROUND OF THE INVENTION

1. Technical Field

The present invention relates to semiconductor memories, and more particularly, to layouts of a decoder in a volatile semiconductor memory device.

2. Discussion of Related Art

Performance trends of electronic systems, such as personal computers or communication devices, have led to high speed and high integration volatile semiconductor memories such as static random access memories (RAMs). More particularly, memory chip manufacturers have developed layout and fabrication techniques for memory cells as critical dimensions have decreased and as functional circuits have been implemented. As process techniques have been developed for reduced critical dimensions, techniques of laying out circuit wirings for peripheral circuits adjacent to a cell area, e.g., circuits in a functional circuit area called a cell core area, have become important in achieving higher integration circuits. A core logic, e.g., a section row decoder, functioning as an interface circuit needed to operate a unit memory cell is an example of a circuit laid out in the functional circuit area.

Within such devices (e.g., a section row decoder), to achieve high speed, read/write operations are performed in parallel with each other in one clock period or cycle. In the case of such semiconductor memory devices, circuits laid out in the functional circuit area become more complex, increasing a layout area. In addition, crosstalk caused by power and signal lines increases.

FIG. 1 is a timing diagram illustrating a data access operation in a typical high speed semiconductor memory device, and more particularly, a timing of a read pulse RD_WL and a write pulse WR_WL simultaneously applied to a word line in one clock period (Tc). A period T1 indicates a time period in which the read pulse is applied to the word line, and a period T2 indicates a read recovery time. Further, a period T3 indicates a time period in which the write pulse is applied to the word line and a period T4 indicates a write recovery time.

FIG. 2 is a diagram illustrating a configuration of a memory mat of a device to which the timing of FIG. 1 is applicable. Referring to FIG. 2, the memory mat, constituting a memory cell array, includes a plurality of blocks. Each block is divided into two memory blocks 100 and 110 by a section row decoder 200. Two main read and write word lines MWL_READ and MWL_WRITE of a main row decoder are connected to the section row decoder 200 in each block. The section row decoder 200 is connected to memory cells via four section word lines at a left side and four section word lines at a right side. Two pair of section word lines SWL_W and two pair of section word lines SWL_X are in the same logic state within one block. The memory mat further includes a main word line decoder (MWL DEC).

When a design rule of 80 or less nanometers is applied, and the cell pitch of the SRAM cell is reduced, it can become difficult to lay out a circuit of a section row decoder to match the reduced cell pitch.

Therefore, a need exists for a decoder having a reduced layout area.

SUMMARY OF THE INVENTION

According to an embodiment of the present invention, a circuit wiring layout in a semiconductor memory device comprises first and second p-type MOS transistors having channels connected to each other in series, and first and second n-type MOS transistors having sources are connected in parallel to a drain of the second p-type MOS transistor. The p- and n-type MOS transistors forming a NOR gating portion for a decoder, wherein the first and second n-type MOS transistors have drains connected to respective first and second main lines and sources connected to a section line. The first and second p-type MOS transistors having gates to which select signals for first and second accesses are applied, respectively. The first and second p-type MOS transistors share an active junction with each other in a first area. The first and second n-type MOS transistors are spaced from the first area in a direction of the section line and have independent active junctions from one another.

According to an embodiment of the present invention, a circuit wiring layout for a section row decoding in a semiconductor memory device comprises a first NOR gating portion including first and second p-type MOS transistors having two divided gate patterns disposed substantially in parallel with each other in the first area and respective channels connected to each other in series, a first n-type MOS transistor formed as a single gate pattern in a second area spaced from the first area in a first direction and having a source connected to a drain of the second p-type MOS transistor, and a second n-type MOS transistor formed as a single gate pattern in a third area spaced from the first area in an opposite direction to the first direction and having a source connected to a drain of the second p-type MOS transistor. The circuit wiring layout comprises a second NOR gating portion including third and fourth p-type MOS transistors disposed in the first area having a substantially similar form as the first and second p-type MOS transistors, being substantially adjacent to the first and second p-type MOS transistors in the first direction, having respective channels connected to each other in series, a third n-type MOS transistor formed as a single gate pattern in the second area, sharing an active junction with the first n-type MOS transistor, and having a source connected to a drain of the fourth p-type MOS transistor, and a fourth n-type MOS transistor formed as a single gate pattern in the third area, sharing an active junction with the second n-type MOS transistor, and having a source connected to a drain of the fourth p-type MOS transistor. The first and third, and second and fourth n-type MOS transistors having drains connected to first and second main word lines, respectively, formed as a second metal layer via a first metal damascene layer, and the first and second n-type MOS transistors and third and fourth n-type MOS transistors having sources connected to first and second section word lines, respectively, as a second metal damascene layer, first and second block select signals for the first and second accesses on the first metal layer being applied to gates of the first and third, and second and fourth p-type MOS transistors, respectively.

BRIEF DESCRIPTION OF THE DRAWINGS

The present invention will become more apparent to those of ordinary skill in the art by describing in detail, preferred embodiments thereof with reference to the attached drawings in which:

FIG. 4 is a plan view illustrating the layout of a construction pattern of a section row decoder of FIG. 3;

FIG. 5 is a diagram illustrating a pattern shape showing a vertical relationship between the construction patterns of FIG. 4; and FIG. 6 is a plan view illustrating a layout after a subsequent process is completed in the plan layout of FIG. 4.

DETAILED DESCRIPTION OF PREFERRED EMBODIMENTS

Figure 1:
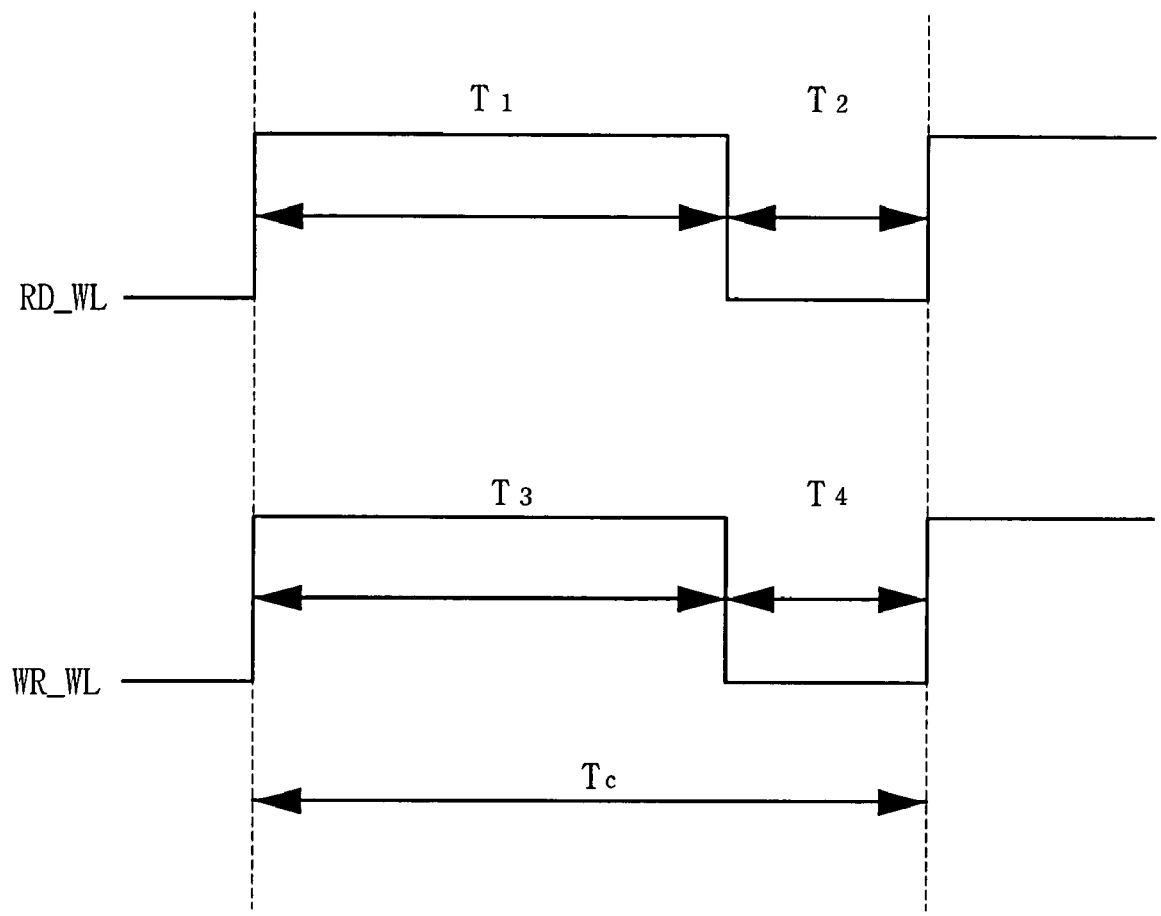
FIG. 1 is a timing diagram illustrating data access in a high speed semiconductor memory device.

The present invention will now be described with reference to the accompanying drawings, in which preferred embodiments of the invention are shown. However, the invention should not be construed as limited to only embodiments set forth herein. Rather, embodiments are presented as teaching examples. In the drawings, like numbers refer to like elements.

Figure 2:
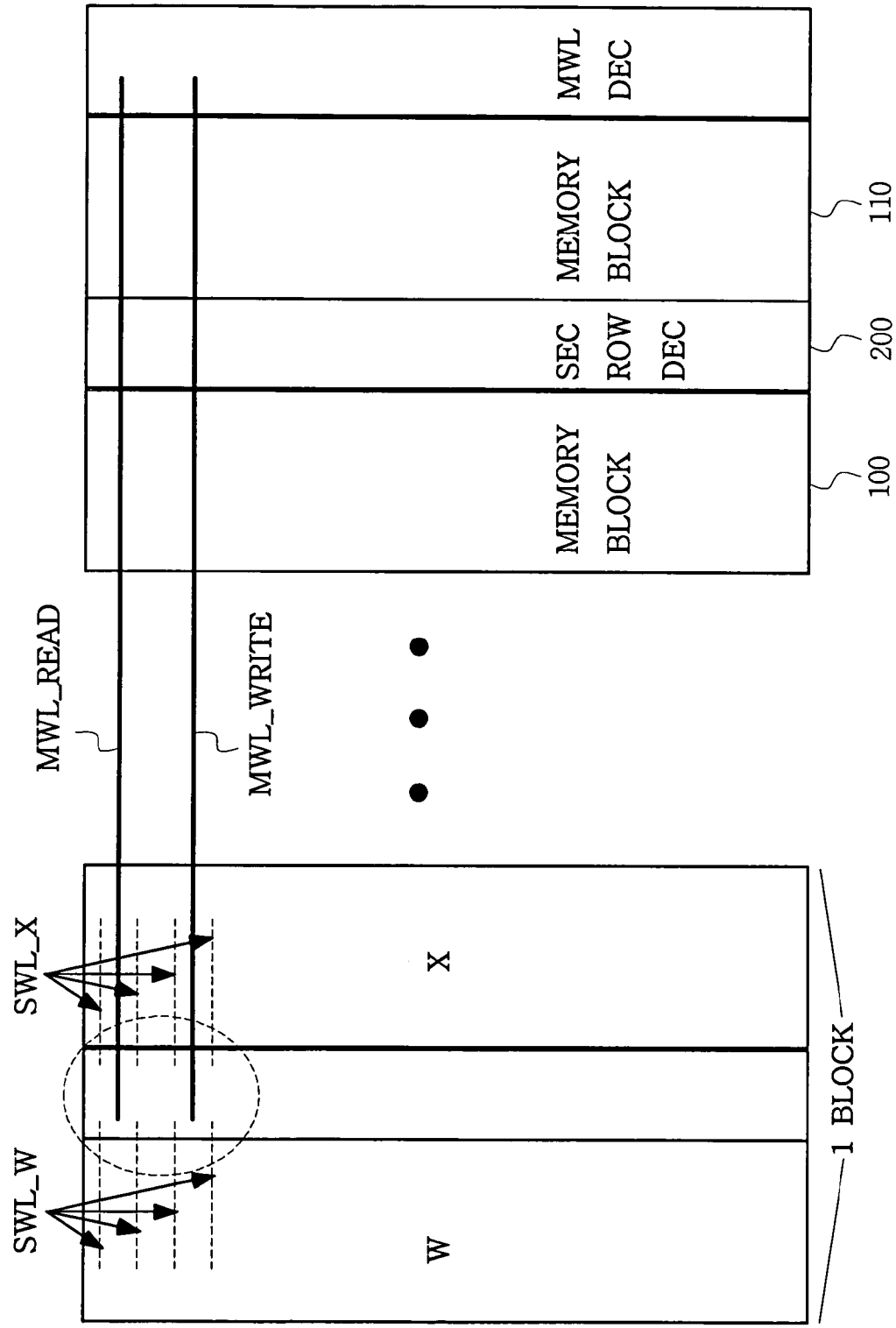
FIG. 2 is a diagram illustrating a configuration of a memory mat of a device to which the timing of FIG. 1 is applied.
Figure 3:
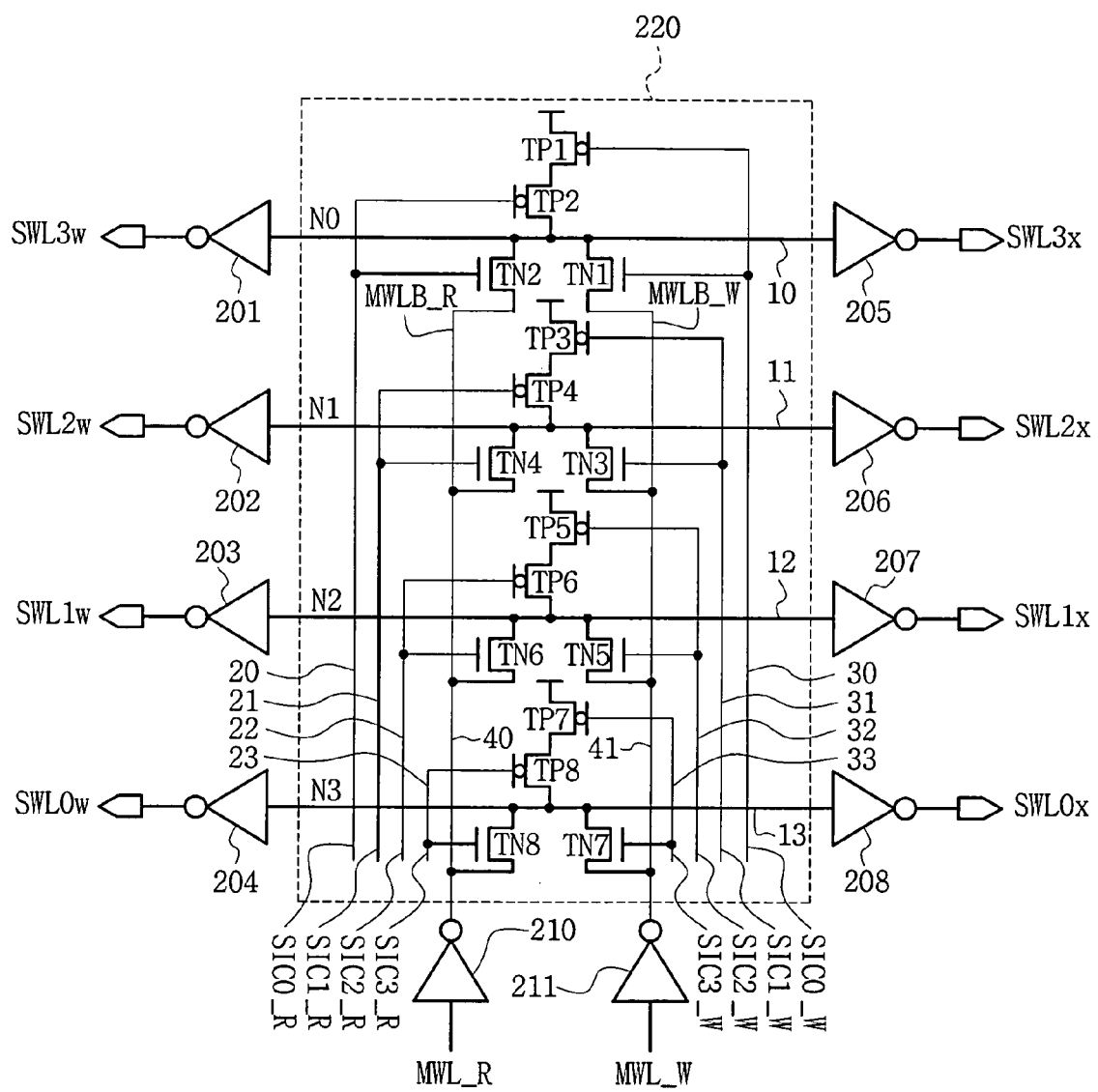
FIG. 3 is a circuit diagram illustrating a section row decoder to which embodiments of the present invention can be applied.

FIG. 3 is a circuit diagram illustrating a section row decoder. A circuit connection structure of FIG. 3 shows an example of the section row decoder 200 in FIG. 2. It is assumed that four pairs of section word lines SWL0w to SWL3w and SWL0x to SWL3x are correspondingly connected to a main read line MWL_READ and a write word line MWL_WRITE.

In FIG. 3, p-type MOS transistors TP1 to TP8 and n-type MOS transistors TN1 to TN8 constitute four NOR type drivers. The p-type MOS transistors TP1 to TP8 are to connected to the main word lines MWL_R and MWL_W. The n-type MOS transistor TN1 to TN8 are connected to four pairs of block select lines SIC0_R to SIC3_R and SIC0_W to SIC3_W. A functional circuit area is implemented having a lay out of the wiring lines and transistors as shown in FIG. 3. The functional circuit area is implemented upon the cell pitch of memory cells connected to the section word lines SWL0w to SWL3w and SWL0x to SWL3x.

In FIG. 3, four NOR gating portions selectively drive the section word lines SWL0w to SWL3w and SWL0x to SWL3x in response to a read/write main word line (MWL) signal and a read/write block select signal. For example, in a write operation, when one of write block select signals SICi_W is activated and a main word line signal MWL_W for writing is activated, the corresponding section word line SWLi is driven. The circuit construction of the section row decoder having the NOR gating portions allows read/write operations to be freely carried out in each memory block. In this case, the four pairs of block select lines SIC0_R to SIC3_R and SIC0_W to SIC3_W are laid out so that the read block select lines are substantially adjacent to one another and write block select lines are substantially adjacent to one another to reduce inter-signal crosstalk. The layout of a power line can affect an occupying area and crosstalk.

According to an embodiment of the present invention, the NOR gating circuit 220 of FIG. 3 is formed in a layout as shown in FIG. 4.

FIG. 4 is a plan view illustrating the layout of a construction pattern of the section row decoder of FIG. 3. For convenience of illustration, a center portion of FIG. 4 is indicated as a first area 221. The p-type MOS transistors TP1 to TP8 of FIG. 3 are laid out in the first area 221. The n-type MOS transistors TN1, TN3, TN5 and TN7 are laid out in a second area 222 located at a right side of the first area 221, and the n-type MOS transistors TN2, TN4, TN6 and TN8 are laid out in a third area 223 located at a left side of the first area 221. The first area 221 is a p-type active area and the second and third areas 222 and 223 are n-type active areas. The pattern of a gate layer formed of polysilicon (e.g., gate poly) is indicated by a non-hatched solid line. For convenience of illustration, the gate layers of the transistors are indicated by the same reference numerals as those of the corresponding transistors of FIG. 3.

Specifically, a first NOR gating portion, constituting the section row decoder together with the inverters 201 and 205 of FIG. 3, includes the first and second p-type MOS transistors TP1 and TP2 laid out in the first area 221, and corresponding first and second n-type MOS transistors TN1 and TN2 laid out in the second and third areas 222 and 223. The first and second n-type MOS transistors TN1 and TN2 are disposed opposite to each other in a direction of the section word line SWL with respect to the first area 221. The first and second p-type MOS transistors TP1 and TP2 are laid out substantially in parallel with each other in the first area 221, have two divided gate patterns, respectively, and have drain-to-source channels connected to each other in series. The first n-type MOS transistor TN1 has a single gate pattern formed in the second area 222, which is spaced from the first area 221 in a first direction, and a source connected to a drain of the second p-type MOS transistor TP2. The second n-type MOS transistor TN2 has a single gate pattern formed in the third area 223, which is spaced from the first area 221 in an opposite direction to the first direction, and a source connected to the drain of the second p-type MOS transistor TP2.

A second NOR gating portion includes the third and fourth p-type MOS transistors TP3 and TP4 laid out substantially adjacent to the first and second p-type MOS transistors TP1 and TP2 in a direction of the section word line within the first area 221. The second NOR gating portion further includes the third n-type MOS transistor TN3 laid out in the second area 222 sharing an active junction with the first n-type MOS transistor TN1, and the fourth n-type MOS transistor TN4 laid out in the third area 223 sharing an active junction with the second n-type MOS transistor TN2. The third and fourth p-type MOS transistors TP3 and TP4 are laid out in the first area 221, are substantially adjacent to the first and second p-type MOS transistors TP1 and TP2 in the first direction, and have drain-to-source channels connected to each other in series. The third n-type MOS transistor TN3 is formed as a single gate pattern in the second area 222 sharing an active junction (drain area) with the first n-type MOS transistor TN1. The third n-type MOS transistor TN3 has a source connected to the drain of the fourth p-type MOS transistor TP4. The fourth n-type MOS transistor TN4 is formed as a single gate pattern in the third area sharing an active junction with the second n-type MOS transistor TN2. The fourth n-type MOS transistor TN4 has a source connected to the drain of the fourth p-type MOS transistor TP4.

A third NOR gating portion includes the fifth and sixth p-type MOS transistors TP5 and TP6 and corresponding fifth and sixth n-type MOS transistors TN5 and TN6. The fifth and sixth p-type MOS transistors TP5 and TP6 are laid out substantially perpendicular to the section word line direction in the first area 221 and substantially adjacent to the first and second p-type MOS transistors TP1 and TP2. The fifth and sixth n-type MOS transistors TN5 and TN6 are laid out substantially perpendicular to the section word line direction in the second and third areas and substantially adjacent to the third and fourth n-type MOS transistors TN3 and TN4.

A fourth NOR gating portion includes the seventh and eighth p-type MOS transistors TP7 and TP8 laid out in the first area 221 in the section word line direction and substantially adjacent to the fifth and sixth p-type MOS transistors TP5 and TP6. The fourth NOR gating portion further includes the seventh n-type MOS transistor TN7 laid out in the second area sharing an active junction (drain area) with the fifth n-type MOS transistor TN5, and the eighth n-type MOS transistor TN8 laid out in the third area sharing an active junction with the sixth n-type MOS transistor TN6.

In FIG. 4, two section row decoders are formed in a line-symmetrical manner with respect to a second section word line, four section row decoders being laid out in one main word line.

In FIG. 4, a first section word line N0, forming an output of the first NOR gating portion, is connected to the drain of the second p-type MOS transistor TP2 and the sources of the first and second n-type MOS transistors TN1 and TN2 and is laid out substantially in a horizontal direction in FIG. 4. The first section word line N0 is formed as a second metal damascene layer.

A second section word line N1, forming an output of the second NOR gating portion, is connected to the drain of the fourth p-type MOS transistor TP4 and to the sources of the third and fourth n-type MOS transistors TN3 and TN4 and is formed substantially in parallel with the first section word line N0 on the same layer.

A third section word line N2, forming an output of the third NOR gating portion, is connected to the drain of the sixth p-type MOS transistor TP6 and to the sources of the fifth and sixth n-type MOS transistors TN5 and TN6 and is formed substantially in parallel with the second section word line N1 on the same layer.

Similarly, a fourth section word line N3, forming an output of the fourth NOR gating portion, is connected to the drain of the eighth p-type MOS transistor TP8 and to the sources of the seventh and eighth n-type MOS transistors TN7 and TN8 and is formed substantially in parallel with the third section word line N2 on the same layer.

A first main word line via line MWLB_W, connected via an inverter 211 to a first main word line MWL_W supplying a first main word line signal, is connected to drains of the first, third, fifth and seventh n-type MOS transistors TN1, TN3, TN5 and TN7 formed in the second area 222. A second main word line via line MWLB_R, connected via an inverter 210 to a second main word line applying a second main word line signal, is connected to the drains of the second, fourth, sixth, and eighth n-type MOS transistors TN2, TN4, TN6 and TN8 formed in the third area 223. The first and second main word line via lines MWLB_W and MWLB_R are formed of a first metal damascene layer. The first and second main word lines are formed of a second metal layer.

A first block select line 30 for first access (e.g., write) is laid out substantially perpendicular to the section word line direction. The first block select line 30 for first access applies a first block select signal SIC0_W for the first access to gates of the first p- and n-type MOS transistors TP1 and TN1.

A second block select line 31 for the first access is laid out substantially perpendicular to the section word line direction. The second block select line 31 for the first access applies a second block select signal SIC1_W for the first access to gates of the third p- and n-type MOS transistors TP3 and TN3.

Similarly, third and fourth block select lines 32 and 33 for the first access are laid out substantially in parallel with the first and second block select lines 30 and 31.

The first to fourth block select lines 30 to 33 for the first access are formed of a first metal layer.

A first block select line 20 for second access (e.g., read) is laid out substantially perpendicular to the section word line direction. The first block select line 20 for second access applies a first block select signal SIC0_R for the second access to gates of the second p- and n-type MOS transistors TP2 and TN2.

A second block select line 21 for the second access is laid out substantially perpendicular to the section word line direction. The second block select line 21 for the second access applies a second block select signal SIC1_R for the second access to gates of the fourth p- and n-type MOS transistors TP4 and TN4.

Similarly, third and fourth block select lines 22 and 23 for the second access are laid out substantially in parallel with the first and second block select lines 20 and 21.

The first to fourth block select lines 20 to 32 for the second access are formed of the first metal layer.

FIG. 5 is a diagram illustrating a pattern shape showing a vertical relationship between the construction patterns of FIG. 4, and FIG. 6 is a plan view illustrating a layout after a subsequent process is completed in a plan layout of FIG. 4.

In FIGS. 5 and 6, vertical relationships between circuits or wiring layers are referred to in an order from a lower layer to a upper layer and in an order of n and p-type active areas, a gate poly layer, a metal zero layer (a first metal damascene layer), a metal zero prime layer (a second metal damascene layer), a metal one layer (a first metal layer), and a metal two layer (a second metal layer). Contacts connecting respective layers between insulating layers are indicated at the right side of FIG. 5.

An active layer is connected to a metal zero layer M0 via a tungsten contact WC, and the metal zero layer M0 is connected to a metal zero prime layer M0P via a contact WCP. The metal zero prime layer M0P is connected to a metal one layer MET1 via a metal contact MC, and the metal one layer MET1 is connected to a metal two layer MET2 via a via contact VIA1. The metal zero layer M0 and the metal zero prime layer M0P are formed of a metal, such as tungsten, in a metal damascene process. Details of the metal damascene process suitable for formation of a fine pattern are well known in the art and detailed description thereof will be omitted.

The n-type MOS transistors present in the same NOR gating portion as shown in FIG. 4 (e.g., TN1 and TN2) are spaced from each other in the section word line direction with respect to the first area. The n-type MOS transistors in the same NOR gating portion do not share an active junction with each other. Further, the n-type MOS transistors in the same NOR gating portion share an active junction with an n-type MOS transistor in an adjacent NOR gating portion. Such a layout significantly reduces a size in a vertical direction to the section word line.

Referring to FIG. 6, there are shown the first main word lines 61 and 62 and the second main word lines 64 and 65. The first and second main word lines and power and ground lines VDD and GND (see also FIG. 4) are formed of a second metal wiring layer. On the second metal wiring layer, the first and second main word lines are laid out substantially adjacent to and substantially in parallel with each other between the line power line and the ground line. Such a layout can reduce crosstalk.

Section word lines 10 to 13 are formed as a second metal damascene wiring layer M0P formed over the first metal damascene wiring layer. The second metal damascene wiring layer M0P is used as a power line VDD that supplies a power supply voltage to the source of the first p-type MOS transistor of FIG. 4 and as an interconnect that connects between the gate of the first p-type MOS transistor and the gate of the first n-type MOS transistor and between the gate of the second p-type MOS transistor and the gate of the second n-type MOS transistor.

Lines SIC0_W to SIC3_W and SIC0_R to SIC3_R are arranged substantially in parallel with each other and substantially perpendicular to the section word lines for delivering first to fourth block select signals for the first and second accesses. The lines SIC0_W to SIC3_W and SIC0_R to SIC3_R are formed as the first metal wiring layer MET1 formed over the second metal damascene wiring layer. The first metal wiring layer is used as lower power and ground lines that are connected to power and ground lines, respectively, on the second metal wiring layer having the first and second main lines formed thereon.

If the gate is patterned as in FIG. 4, variations in the critical dimension of the gate poly can be reduced. For example, the reduced variation in the critical dimension enables such a gate pattern to be implemented using a photolithographic process of about 80 nanometers or less. As a result, the structure of FIG. 4 is suitable for implementation of a high performance, small area and photolithography-friendly layout.

As described above, a wider layout margin is obtained when the circuit wiring lines are formed of a metal zero prime layer (M0P). This allows the transistors and wiring lines constituting the section row decoder in the functional circuit area to be efficiently laid out within a limited size even when the cell pitch is reduced. Further, the layout of the NOR gating portion as described above allows circuit wiring layers of the transistors to be laid out to match the cell pitch of a two- or three-dimensional, high integration memory cell.

It will be appreciated by those skilled in the art that the concepts proposed herein may be applied to specific embodiments in several manners. The proposed number of the section word line drivers is illustrative. A number of methods available to circuit designers are possible.

While exemplary embodiments of the present invention have been described in the detailed description, it will be apparent that modifications may be made within the scope of the present invention. For example, through modifications of embodiments, circuit wiring layers may be formed as a metal zero prime layer. While the metal zero prime layer has been described as being the metal damascene wiring layer, it may be implemented as another layer.

As described above, according to a circuit wiring layout of the present invention, it is possible to implement a functional circuit area adjacent to a cell area within a reduced occupying area. It is also possible to efficiently lay out the transistors constituting the section row decoder within a limited size and to lay out wiring layers for the transistors to match the cell pitch of a high integration memory cell. Thus, in a three-dimensional memory cell in which transistors constituting an SRAM memory cell are laid out on a different layer, it is possible to implement a core cell area connected to the cell within a smaller occupying area.

What is claimed is:

1. A circuit wiring layout in a semiconductor memory device, the layout comprising:
   first and second p-type MOS transistors having channels connected to each other in series, and first and second n-type MOS transistors having sources are connected in parallel to a drain of the second p-type MOS transistor, the first and second p-type MOS transistors and the first and second n-type MOS transistors forming a NOR gating portion for a decoder, wherein
   the first and second n-type MOS transistors having drains connected to first and second main lines, respectively, and sources connected to a section line, the first and second p-type MOS transistors having gates to which select signals for first and second accesses are applied, respectively, and the first and second p-type MOS transistors sharing an active junction with each other in a first area, and wherein the first and second n-type MOS transistors are spaced from the first area substantially in a direction of the section line and have individual active junctions.

2. The layout according to claim 1, wherein four NOR gating portions for a decoder are connected to the first and second main lines in common.

3. The layout according to claim 1, wherein the NOR gating portion for a decoder is a NOR gate for a section row decoder.

4. The layout according to claim 3, wherein the main line is a main word line, the section line is a section word line, and the select signal is a block select signal.

5. The layout according to claim 1, wherein the first and second main lines are formed as a second metal wiring layer and connected to the drains of the first and second n-type MOS transistors via a first metal damascene wiring layer.

6. The layout according to claim 5, wherein the section line is formed as a second metal damascene wiring layer formed over the first metal damascene wiring layer.

7. The layout according to claim 6, wherein the second metal damascene wiring layer is further used as a power line for supplying a power supply voltage to a source of the first p-type MOS transistor and as an interconnect line for connecting between the gates of the first p- and n-type MOS transistors and between the gate of the second p-type MOS transistor and a gate of the second n-type MOS transistors.

8. The layout according to claim 7, wherein lines are laid out substantially in parallel with each other and substantially perpendicular to the section line for delivering the select signals for the first and second accesses, and are formed as a first metal wiring layer formed over the second metal damascene wiring layer.

9. The layout according to claim 8, wherein the first metal wiring layer is further used as a lower power line and a ground line that are connected to a power line and a ground line, respectively, on a second metal wiring layer having the first and second main lines formed thereon.

10. The layout according to claim 9, wherein the first and second main lines on the second metal wiring layer are laid out substantially adjacent to each other between the power line and the ground line.

11. The layout according to claim 10, wherein the first and second p-type MOS transistors and the first and second n-type MOS transistors are laid out in a functional circuit area substantially adjacent to a memory cell area.

12. A circuit wiring layout in a semiconductor memory device, the layout comprising:

first and second p-type MOS transistors having channels connected to each other in series and first and second n-type MOS transistors having sources connected in parallel to a drain of the second p-type MOS transistor, the first and second p-type MOS transistors and the first and second n-type MOS transistors forming a NOR gating portion for a section row decoder, and first and second main word lines being connected to first to fourth NOR gating portions, wherein four pairs of the first and second n-type MOS transistors disposed in the first to fourth NOR gating portions, respectively, the four first n-type MOS transistors having drains connected to the first main word line and the four second n-type MOS transistors having drains connected to the second main word line, and the four pairs of first and second n-type MOS transistors having sources connected to first to fourth section word lines, respectively, and first to fourth block select signals for first and second accesses are applied to gates of the four pairs of the first and second p-type MOS transistors, respectively, and four pairs of the first and second p-type MOS transistors disposed in the first to fourth NOR gating portions sharing first to forth active junctions with each other in the first area, respectively, the first and second n-type MOS transistors in the same NOR gating portion are spaced from the first area in a direction of the section word line, the first and second n-type MOS transistors having individual active junctions and the first and second n-type MOS transistors sharing the active junctions with corresponding first and second n-type MOS transistors in an adjacent NOR gating portion.

13. The layout according to claim 12, wherein the first and second main lines are formed as a second metal wiring layer and connected to the drains of the first and second n-type MOS transistors via a first metal damascene wiring layer.

14. The layout according to claim 13, wherein the section world line is formed as a second metal damascene wiring layer formed over the first metal damascene wiring layer.

15. The layout according to claim 14, wherein the second metal damascene wiring layer is further used as a power line for supplying a power supply voltage to the source of the first p-type MOS transistor and as an interconnect line for connecting between the gates of the first p- and n-type MOS transistors and between the gates of the second p- and n-type MOS transistors.

16. The layout according to claim 15, wherein lines are laid out substantially in parallel with each other and substantially perpendicular to the section line for delivering the first to fourth block select signals for the first and second accesses, and are formed as a first metal wiring layer formed over the second metal damascene wiring layer.

17. The layout according to claim 16, wherein the first metal wiring layer is further used as a lower power line and a ground line that are connected to a power line and a ground line, respectively, on a second metal wiring layer having the first and second main lines formed thereon.

18. The layout according to claim 17, wherein the first and second main lines on the second metal wiring layer are laid out substantially adjacent to each other between the power line and the ground line.

19. The layout according to claim 18, wherein the first and second p-type MOS transistors and the first and second n-type MOS transistors are laid out in a functional circuit area substantially adjacent to a memory cell area.

20. A semiconductor memory device having a section row decoder, the device comprising:

a first NOR gating portion including first and second p-type MOS transistors disposed in a first area, and first and second n-type MOS transistors disposed in second and third areas opposite to each other with respect to the first area in a direction of a section word line;

a second NOR gating portion including third and fourth p-type MOS transistors disposed in the first area and substantially adjacent to the first and second p-type MOS transistors substantially in the section word line direction, a third n-type MOS transistor disposed in the second area sharing a first active junction with the first n-type MOS transistor, and a fourth n-type MOS transistor disposed in the third area sharing a second active junction with the second n-type MOS transistor;

a third NOR gating portion including fifth and sixth p-type MOS transistors disposed substantially perpendicular to the section word line direction in the first area and substantially adjacent to the first and second p-type MOS transistors, and fifth and sixth n-type MOS transistors disposed substantially perpendicular to the section word line direction in the second and third areas and substantially adjacent to the third and fourth n-type MOS transistors; and a fourth NOR gating portion including seventh and eighth p-type MOS transistors disposed in the first area and substantially adjacent to the fifth and sixth p-type MOS transistors substantially in the section word line direction, a seventh n-type MOS transistor disposed in the second area sharing a third active junction with the fifth n-type MOS transistor, and an eighth n-type MOS transistor disposed in the third area a forth active junction with the sixth n-type MOS transistor.

21. The device according to claim 20, further comprising:

a first section word line connected to a drain of the second p-type MOS transistor and sources of the first and second n-type MOS transistors to form an output of the first NOR gating portion;

a second section word line connected to a drain of the fourth p-type MOS transistor and sources of the third and fourth n-type MOS transistors to form an output of the second NOR gating portion;

a third section word line connected to a drain of the sixth p-type MOS transistor and sources of the fifth and sixth n-type MOS transistors to form an output of the third NOR gating portion; and a fourth section word line connected to a drain of the eighth p-type MOS transistor and sources of the seventh and eighth n-type MOS transistors to form an output of the four NOR gating portion.

22. The device according to claim 21, further comprising:

a first main word line connected to the first active junction of the first and third n-type MOS transistors, and the third active junction of the fifth and seventh n-type MOS transistors formed in the second area for applying a first main word line signal; and a second main word line connected to the second active junction of the second and fourth n-type MOS transistors, and the fourth active junction of the sixth and eighth n-type MOS transistors formed in the third area for applying a second main word line signal, wherein the first to forth active junctions are drains.

23. The device according to claim 22, further comprising:
a first block select line for first access, disposed substantially perpendicular to the section word line direction, for applying a first block select signal for the first access to gates of the first p- and n-type MOS transistors;
a second block select line for the first access, disposed substantially perpendicular to the section word line direction, for applying a second block select signal for the first access to gates of the third p- and n-type MOS transistors;
a third block select line for the first access, disposed substantially perpendicular to the section word line direction, for applying a third block select signal for the first access to gates of the fifth p- and n-type MOS transistors;
a fourth block select line for the first access, disposed substantially perpendicular to the section word line direction, for applying a fourth block select signal for the first access to gates of the seventh p- and n-type MOS transistors;
a first block select line for second access, disposed substantially perpendicular to the section word line direction, for applying a first block select signal for the second access to gates of the second p- and n-type MOS transistors;
a second block select line for the second access, disposed substantially perpendicular to the section word line direction, for applying a second block select signal for the second access to gates of the fourth p- and n-type MOS transistors;
a third block select line for the second access, disposed substantially perpendicular to the section word line direction, for applying a third block select signal for the second access to gates of the sixth p- and n-type MOS transistors; and
a fourth block select line for the second access, disposed substantially perpendicular to the section word line direction, for applying a fourth block select signal for the second access to gates of the eighth p- and n-type MOS transistors.

24. A circuit wiring layout for section row decoding in a semiconductor memory device, the layout comprising:
a first NOR gating portion including first and second p-type MOS transistors having two divided gate patterns disposed substantially in parallel with each other in the first area and respective channels connected to each other in series, a first n-type MOS transistor formed as a single gate pattern in a second area spaced from the first area in a first direction and having a source connected to a drain of the second p-type MOS transistor, and a second n-type MOS transistor formed as a single gate pattern in a third area spaced from the first area in an opposite direction to the first direction and having a source connected to a drain of the second p-type MOS transistor; and
a second NOR gating portion including third and fourth p-type MOS transistors disposed in the first area having a substantially similar form as the first and second p-type MOS transistors, being substantially adjacent to the first and second p-type MOS transistors in the first direction and having respective channels connected to each other in series, a third n-type MOS transistor formed as a single gate pattern in the second area, sharing a first active junction with the first n-type MOS transistor and having a source connected to a drain of the fourth p-type MOS transistor, and a fourth n-type MOS transistor formed as a single gate pattern in the third area, sharing a second active junction with the second n-type MOS transistor and having a source connected to a drain of the fourth p-type MOS transistor, wherein
the first and third, and second and fourth n-type MOS transistors having drains connected to first and second main word lines, respectively, formed as a second metal layer via a first metal damascene layer, and the first and second n-type MOS transistors and third and fourth n-type MOS transistors having sources connected to first and second section word lines, respectively, as a second metal damascene layer, first and second block select signals for the first and second accesses on the first metal layer being applied to gates of the first and third, and second and fourth p-type MOS transistors, respectively.

25. The layout according to claim 24, wherein two section row decoders are formed in a line-symmetrical manner with respect to the second section word line, such that four section row decoders are disposed in one main word line.

26. A row decoder structure in a semiconductor memory device, wherein read and write operations are performed during one clock cycle, the row decoder structure comprising:
a plurality of main word lines, wherein the main word lines are inputs of a section row decoder producing four section word lines;
a NOR gating portion constituting the section row decoder including two serial PMOS transistors and two parallel NMOS transistors, wherein the main word lines are connected to corresponding sources of the two parallel NMOS transistors via a first metal damascene layer.

27. The layout according to claim 26, wherein the NOR gating portion is a selected portion of the section row decoder and independently receives a block select signal and main word line signals for a read operation and a write operation, the block select signals including four block select signals for the read operation and four block select signals for the write operation, the read block select signals are disposed substantially adjacent to each other as the first metal layer, and the write block select signals are disposed substantially adjacent to each other as the first metal layer.

28. The layout according to claim 27, further comprising a power line disposed between the read block select signal and the write block select signal.

29. The layout according to claim 28, further comprising a power line disposed between the signals for read and write.

30. The layout according to claim 29, wherein the two parallel NMOS transistors of the NOR gating portion have independent active junctions from one another and share the respective active junctions with a corresponding pair of NMOS transistors of an adjacent NOR gating portion connected to an adjacent section word line.

* * * * *